US012562690B2

(12) United States Patent
Vallabhaneni et al.

(10) Patent No.: US 12,562,690 B2
(45) Date of Patent: Feb. 24, 2026

(54) LINEARIZATION OF LOW GAIN LOW-NOISE AMPLIFIERS THROUGH THIRD-ORDER DISTORTION CANCELLATION

(71) Applicant: QUALCOMM Incorporated, San Diego, CA (US)

(72) Inventors: Madhukar Vallabhaneni, Bengaluru (IN); Girish Koppassery, Bangalore (IN); Mehmet Uzunkol, San Diego, CA (US); Amjath Husain, Bangalore (IN); Abhay Shankar Gaikwad, Satara (IN); Rishab Maheshwari, Bangalore (IN); Samiran Dasgupta, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 593 days.

(21) Appl. No.: 17/972,244

(22) Filed: Oct. 24, 2022

(65) Prior Publication Data

US 2023/0137735 A1 May 4, 2023

Related U.S. Application Data

(60) Provisional application No. 63/274,416, filed on Nov. 1, 2021.

(51) Int. Cl.
*H03F 3/191* (2006.01)
*H03F 1/32* (2006.01)
*H04B 1/00* (2006.01)

(52) U.S. Cl.
CPC ......... *H03F 1/3205* (2013.01); *H04B 1/0039* (2013.01); *H03F 2200/451* (2013.01)

(58) Field of Classification Search
CPC ....................................................... H03F 3/191
(Continued)

(56) References Cited

U.S. PATENT DOCUMENTS

| | | | | |
|---|---|---|---|---|
| 8,593,225 | B2 * | 11/2013 | Hellberg | ................... H03F 3/16 |
| | | | | 330/277 |
| 10,601,376 | B2 * | 3/2020 | Gaynor | ..................... H03F 1/26 |

(Continued)

OTHER PUBLICATIONS

International Search Report and Written Opinion—PCT/US2022/047752—ISA/EPO—Feb. 24, 2023.
(Continued)

*Primary Examiner* — Henry Choe
(74) *Attorney, Agent, or Firm* — Loza & Loza LLP

(57) ABSTRACT

An aspect of the disclosure relates to a method of reducing a third-order intermodulation component at a first terminal of a transistor, including: receiving an input radio frequency (RF) signal cycling with a first frequency at a control terminal of the transistor; generating a feedback RF signal cycling at a second frequency at a second terminal of the transistor, wherein the second frequency is substantially twice the first frequency; and generating a third-order intermodulation cancellation component at the first terminal including combining the input RF signal with the feedback RF signal, wherein the third-order intermodulation cancellation component has a magnitude and phase substantially equal to and opposite a magnitude and phase of the third-order intermodulation component at the first terminal of the transistor, respectively.

28 Claims, 6 Drawing Sheets

(58) Field of Classification Search
USPC .................................................. 330/302, 305
See application file for complete search history.

(56)                    References Cited

U.S. PATENT DOCUMENTS

| 2014/0340153 | A1* | 11/2014 | Wilhelmsson | ......... H03G 3/001 |
| | | | | 330/278 |
| 2016/0072442 | A1 | 3/2016 | Testi et al. | |
| 2019/0288649 | A1 | 9/2019 | Gaynor | |
| 2021/0067121 | A1 | 3/2021 | Hua et al. | |

OTHER PUBLICATIONS

Sheng L., et al., "A General Theory of Third-Order Intermodulation Distortion in Common-Emitter Radio Frequency Circuits", Proceedings of the 2003 International Symposium on Circuits and Systems. ISCAS 2003, vol. 1, May 25, 2003, pp. 1-177-1-180, XP093022983, DOI: 10.1109/ISCAS.2003.1205529, ISBN: 978-0-7803-7761-5, pp. I-177, Left-hand Column, line 2, pp. I-180, Right-hand Column, Line 16, Figures 1-4.

* cited by examiner

Legend:

$V_{in} = A\cos\Psi_1 + A\cos\Psi_2$

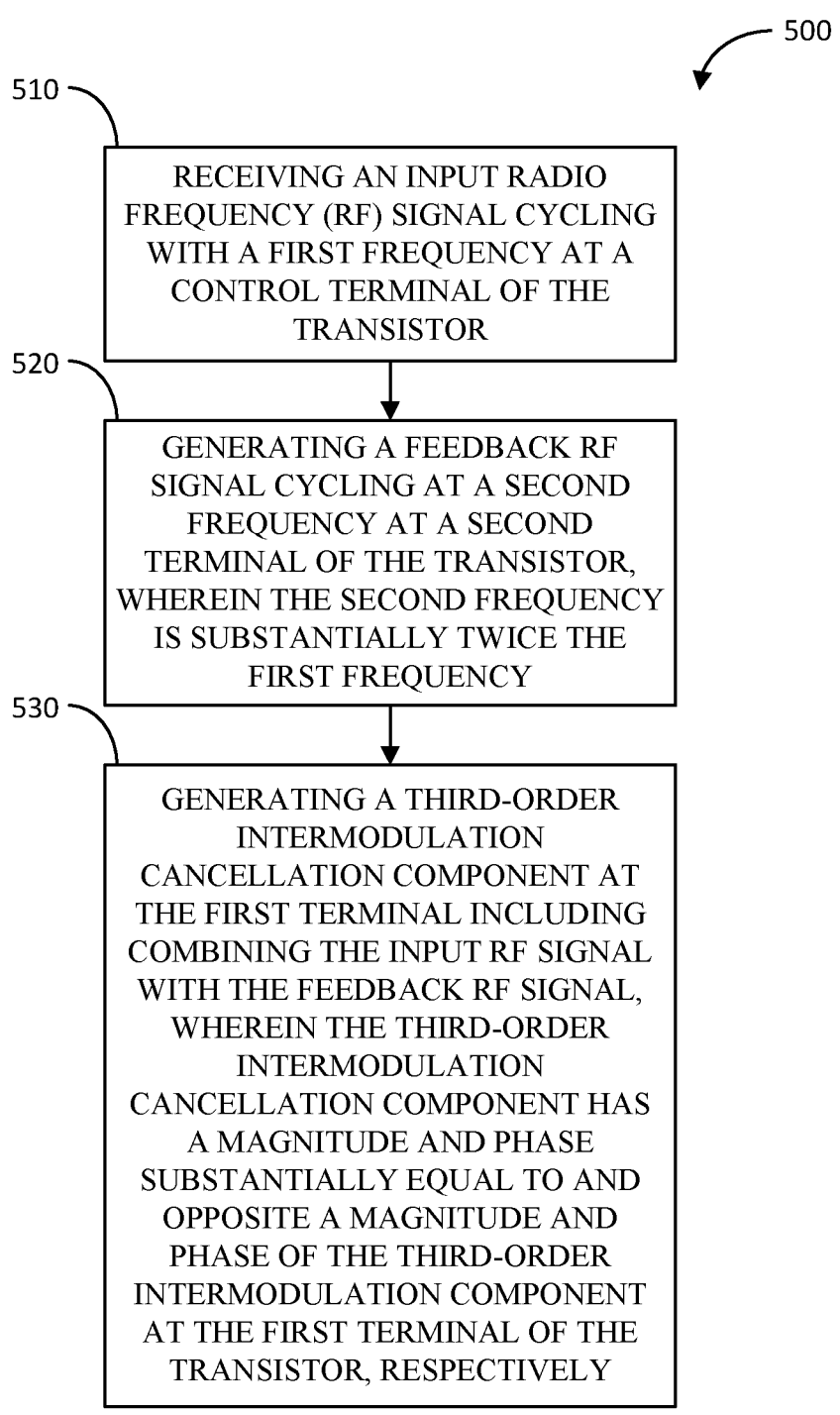

510 — RECEIVING AN INPUT RADIO FREQUENCY (RF) SIGNAL CYCLING WITH A FIRST FREQUENCY AT A CONTROL TERMINAL OF THE TRANSISTOR

520 — GENERATING A FEEDBACK RF SIGNAL CYCLING AT A SECOND FREQUENCY AT A SECOND TERMINAL OF THE TRANSISTOR, WHEREIN THE SECOND FREQUENCY IS SUBSTANTIALLY TWICE THE FIRST FREQUENCY

530 — GENERATING A THIRD-ORDER INTERMODULATION CANCELLATION COMPONENT AT THE FIRST TERMINAL INCLUDING COMBINING THE INPUT RF SIGNAL WITH THE FEEDBACK RF SIGNAL, WHEREIN THE THIRD-ORDER INTERMODULATION CANCELLATION COMPONENT HAS A MAGNITUDE AND PHASE SUBSTANTIALLY EQUAL TO AND OPPOSITE A MAGNITUDE AND PHASE OF THE THIRD-ORDER INTERMODULATION COMPONENT AT THE FIRST TERMINAL OF THE TRANSISTOR, RESPECTIVELY

LINEARIZATION OF LOW GAIN LOW-NOISE AMPLIFIERS THROUGH THIRD-ORDER DISTORTION CANCELLATION

CROSS-REFERENCE TO RELATED APPLICATION

This application claims the benefit of the filing date of U.S. Provisional Application, Ser. No. 63/274,416, filed on Nov. 1, 2021, which is incorporated herein by reference.

FIELD

Aspects of the present disclosure relate generally to amplifiers, and in particular, to techniques for linearizing low-gain low noise amplifiers (LNAs) through third-order distortion cancellation.

BACKGROUND

A wireless device (e.g., smart phone) may transmit and receive radio frequency (RF) signals in one or more wireless networks (e.g., long-term evolution (LTE) network, fifth generation (5G) network, wireless local area network (WLAN), etc.). To receive RF signals, the wireless device includes one or more antennas and one or more low noise amplifiers (LNAs) configured to amplify RF signals received by the one or more antennas. An amplifier, such as a low noise amplifier (LNA), may include a transconductance (gm) device, such as a transistor (e.g., field effect transistor (FET), bipolar junction transistor (BJT), etc.) configured to receive an input radio frequency (RF) signal and generate an output RF signal based on a gain of the input RF signal. Often, the transistor has non-linear characteristics, which produces third-order intermodulation components in the output RF signal, which are undesired and distorts the output RF signal. Accordingly, to reduce the distortion in the output RF signal due to third-order inter-modulation components, there is a need for techniques to reduce or eliminate the third-order intermodulation components from the output RF signal.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an amplifier. The amplifier includes a first transistor; an impedance matching circuit configured to receive an input radio frequency (RF) signal within an operating frequency band of the amplifier, wherein the impedance matching circuit is coupled to a control input of the first transistor; an output impedance circuit configured to generate an output RF signal within the operating frequency band; and a first tank circuit configured to produce a resonance impedance at a first frequency substantially twice a second frequency of the input RF signal, wherein the output impedance circuit, the first transistor, and the first tank circuit are coupled in series between a first voltage rail and a second voltage rail.

Another aspect of the disclosure relates to a method of reducing a third-order intermodulation component at a first terminal of a transistor. The method includes receiving an input radio frequency (RF) signal cycling with a first frequency at a control terminal of the transistor; generating a feedback RF signal cycling at a second frequency at a second terminal of the transistor, wherein the second frequency is substantially twice the first frequency; and generating a third-order intermodulation cancellation component at the first terminal including combining the input RF signal with the feedback RF signal, wherein the third-order intermodulation cancellation component has a magnitude and phase substantially equal and opposite to a magnitude and phase of the third-order intermodulation component at the first terminal of the transistor, respectively.

Another aspect of the disclosure relates to an apparatus for reducing a third-order intermodulation component at a first terminal of a transistor. The apparatus includes means for receiving an input radio frequency (RF) signal cycling with a first frequency at a control terminal of the transistor; means for generating a feedback RF signal cycling at a second frequency at a second terminal of the transistor, wherein the second frequency is substantially twice the first frequency; and means for generating a third-order inter-modulation cancellation component at the first terminal including combining the input RF signal with the feedback RF signal, wherein the third-order intermodulation cancellation component has a magnitude and phase substantially equal to and opposite a magnitude and phase of the third-order intermodulation component at the first terminal of the transistor, respectively.

Another aspect of the disclosure relates to a wireless communication device, including: at least one antenna; a transceiver coupled to the at least one antenna, wherein the transceiver comprises a low noise amplifier (LNA) including: a first transistor, an impedance matching circuit configured to receive an input radio frequency (RF) signal within an operating frequency band of the LNA, wherein the impedance matching circuit is coupled to a control input of the first transistor, an output impedance circuit configured to generate an output RF signal within the operating frequency band, and a first tank circuit configured to produce a resonance impedance at a frequency substantially twice a frequency of the input RF signal, wherein the output impedance circuit, the first transistor, and the first tank circuit are coupled in series between a first voltage rail and a second voltage rail; and a communication processor coupled to the transceiver.

Another aspect of the disclosure includes an amplifier, including a first transistor having a gate configured to receive an input radio frequency (RF) signal within an operating frequency band of the amplifier; a load circuit coupled between a first voltage rail and a drain of the first transistor and configured to generate an output RF signal within the operating frequency band; and a first tank circuit coupled between a source of the first transistor and a second voltage rail, the first tank circuit including an inductor coupled between the source of the first transistor and the second voltage rail, the first tank circuit further including a variable capacitor device coupled in series with a variable resistive device, the variable capacitor device and the variable resistive device coupled between the source of the first transistor and the second voltage rail.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

BRIEF DESCRIPTION OF THE DRAWINGS

FIG. 5 illustrates a flow diagram of an example method of reducing a third-order intermodulation component from an output of a low noise amplifier (LNA) in accordance with another aspect of the disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
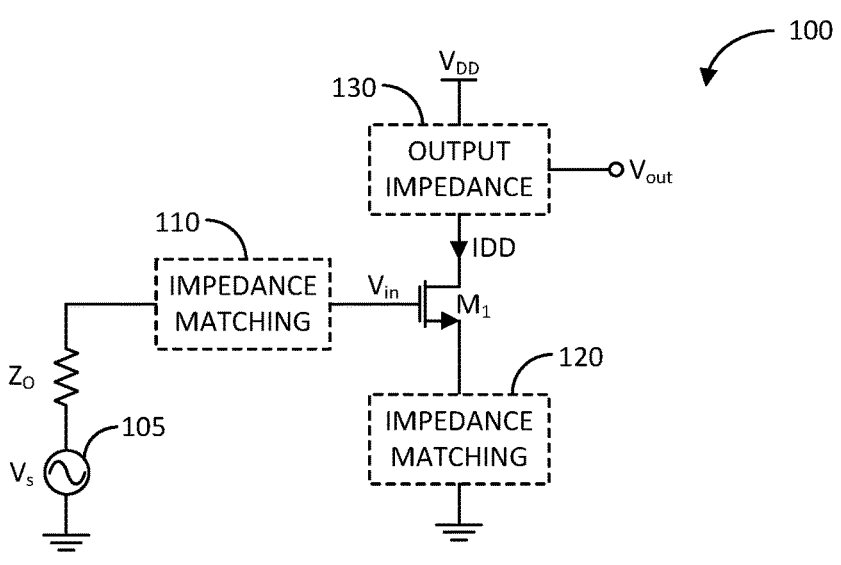
FIG. 1A illustrates a block diagram of an example low noise amplifier (LNA) in accordance with an aspect of the disclosure.

FIG. 1A illustrates a block diagram of an example low noise amplifier (LNA) 100 in accordance with an aspect of the disclosure. The LNA 100 includes a transistor $M_1$, which may be implemented as a field effect transistor (FET), or more specifically, an n-channel metal oxide semiconductor (NMOS) FET. It shall be understood that the transistor $M_1$ may be of another type, such as a p-channel metal oxide semiconductor (PMOS FET), bipolar junction transistor (BJT), or other. However, for ease of explanation, the transistor $M_1$ is referred to herein as NMOS FET $M_1$. The LNA 100 further includes an input impedance matching circuit 110 coupled to a gate terminal (generally control input, or base terminal if $M_1$ is a BJT) of the NMOS FET $M_1$.

The input impedance matching circuit 110 is configured to receive a source radio frequency (RF) signal $V_s$ from an RF signal source 105, such as at least one antenna and/or associated circuitry. As depicted, the RF signal source 105 may have an intrinsic impedance of $Z_o$. As the input impedance of the gate (control input) of the NMOS FET $M_1$ may not be the same as the intrinsic impedance $Z_o$ of the RF signal source 105, the input impedance matching circuit 110 is configured to present an impedance substantially the same as $Z_o$ to reduce return loss at the input of the LNA 100. As an example, the input impedance matching network 110 is configured to produce a minimum return loss within the operating frequency band of the LNA 100.

The LNA 100 may include an optional input impedance matching circuit 120 between a source terminal (or emitter terminal if $M_1$ is a BJT) of the NMOS FET $M_1$ and a lower voltage rail (e.g., ground). The optional impedance matching circuit 120 may assist the input impedance matching circuit 110 to better match the input impedance of the LNA 100 to the intrinsic impedance $Z_o$ of the RF signal source 105.

The LNA 100 further includes an output impedance circuit 130 coupled in series with the NMOS FET $M_1$ and the optional impedance matching circuit 120 between an upper voltage rail $V_{DD}$ and the lower voltage rail (e.g., ground). More specifically, the output impedance circuit is coupled between the upper voltage rail $V_{DD}$ and a drain terminal (or collector terminal if $M_1$ is a BJT) of the NMOS FET $M_1$. The output impedance circuit 130 is configured to generate an output RF signal $V_{out}$, which is based on amplifying an input RF signal $V_{in}$ at the gate of the NMOS FET $M_1$. The input impedance matching circuit 110 is configured to produce the input RF signal $V_{in}$ including impedance matching filtering of the source RF signal $V_s$ (e.g., substantially rejecting signals not within the operating frequency band of the LNA 100 via relatively high return loss, and allowing the input RF signal $V_{in}$ to propagate to the gate of the NMOS FET $M_1$ via relatively low or minimal return loss).

The signal-to-noise ratio (SNR) of the output RF signal $V_{out}$ is affected by the gain or gain mode of the LNA 100. For example, if a relatively high SNR for the output RF signal $V_{out}$ is desired, the LNA 100 may be operated in a relatively low gain mode (e.g., G4 (e.g., 9 decibel (dB) of gain), or G5 (e.g., 6 dB of gain)). In relatively low gain mode, the SNR degradation is dominated by the third-order intermodulation components (IMD3) produced by a third-order component or derivative of the transconductance ($g_m$) device (e.g., NMOS FET $M_1$) of the LNA 100, where IDD is the drain current of the NMOS FET $M_1$. The linearization of the LNA 100 is typically characterized by the third-order intercept point (IIP3), which is the power of the output RF signal $V_{out}$ at which the power of the third-order intermodulation components (IMD3) substantially equals to the power of the fundamental components of the input RF signal $V_{in}$. This is explained in more detail further herein.

Figure 1B:
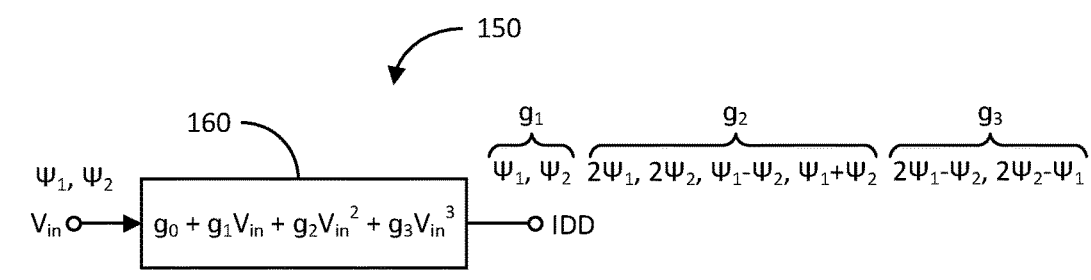
FIG. 1B illustrates a block diagram of an example linearization model of the LNA of FIG. 1A in accordance with another aspect of the disclosure.

FIG. 1B illustrates a block diagram of an example linearization model 150 of the LNA 100 in accordance with another aspect of the disclosure. The linearization model 150 of the LNA 100 is characterized by a linearization model 160 of the transconductance ($g_m$) device, which, as discussed, is the NMOS FET $M_1$. The linearization model 160 of the NMOS FET $M_1$ may be characterized by the following polynomial equation:

$$IDD = g_0 + g_1 V_{in} + g_2 V_{in}^2 + g_3 V_{in}^3 \qquad \text{Eq. 1}$$

Where $g_0$, $g_1$, $g_{02}$, and $g_3$ are the zeroth, first, second, and third-order coefficients of the polynomial, $V_{in}$ is the RF signal at the input of the transconductance ($g_m$) device or gate of the NMOS FET $M_1$, and IDD is the drain current of the NMOS FET $M_1$. Stated differently, the coefficients $g_1$, $g_2$, and $g_3$ are the first, second, and third derivatives of the transconductance gain $g_m$ of the NMOS FET $M_1$.

In this example, the input RF signal $V_{in}$ at the gate of the NMOS FET $M_1$ may include two in-band frequency components (within the operating frequency band of the LNA 100), as indicated by the following equation:

$$V_{in} = A \cos(\psi_2) + A \cos(\psi_2) \qquad \text{Eq. 2}$$

Where $\psi_1$ is equal to $2\pi f_1(t)$ or $\omega_1$ and $\psi_2$ is equal to $2\pi f_2(t)$ or $\omega_2(t)$, where $f_1$ and $f_2$ are the frequencies of the in-band frequency components, $\omega_1$ and $\omega_2$ are the frequencies in radians of the in-band frequency components, and (t) represents time. Due to the non-linear characteristics of the transconductance $g_m$ of the NMOS FET $M_1$, the drain current IDD of the NMOS FET $M_1$ has the following frequency components:

$$IDD = A\cos(\psi_1) + A\cos(\psi_2) \text{ due to the } g_1 \text{ coefficient} \qquad \text{Eq. 3}$$

$$IDD = A\cos(2\psi_1) + A\cos(2\psi_2) + A\cos(\psi_1 - \psi_2) + A\cos(\psi_1 + \psi_2), \qquad \text{Eq. 4}$$

$$\text{due to the } g_2 \text{ coefficient}$$

$$IDD = A\cos(2\psi_1 - \psi_2) + A\cos(2\psi_2 - \psi_1) \text{ due to the } g_3 \text{ coefficient} \qquad \text{Eq. 5}$$

Figure 1C:
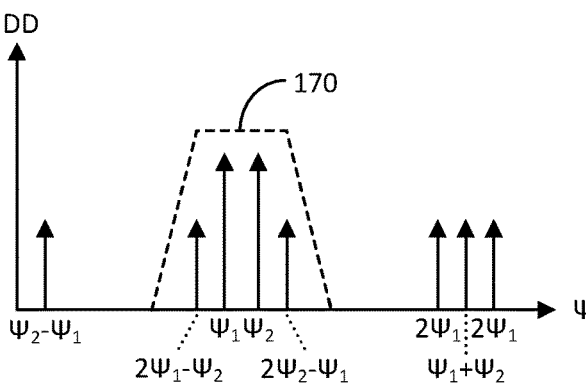
FIG. 1C illustrates a graph depicting example frequency components at a drain terminal of a field effect transistor (FET) of the LNA of FIG. 1A in accordance with another aspect of the disclosure.

FIG. 1C illustrates a graph depicting example frequency components of the drain current IDD of the NMOS FET $M_1$ of the LNA 100 in accordance with another aspect of the disclosure. The horizontal axis of the graph represents frequency in terms of tp. The vertical axis of the graph represents magnitude of the drain current IDD. The vertical arrows represent the frequency components of the drain current IDD. The dashed trapezoid 170 represents the operating frequency band of the LNA 100, which may be dictated by the output impedance circuit 130, which may include a resonant or tank circuit to pass through in-band frequency components and reject out-of-band frequency components to generate the output RF signal $V_{out}$.

As the graph illustrates, the frequency components $\psi_1$ and $\psi_2$ due to the $g_1$ transconductance coefficient are the fundamental in-band frequencies, and are shown to be within the operating band 170 of the LNA 100. Thus, these components $\psi_1$ and $\psi_2$ are the desired frequency components for the output RF signal $V_{out}$. The frequency components $2\psi_1$, $2\psi_2$, $\psi_1 - \psi_2$, and $\psi_1 + \psi_2$ due to the $g_2$ transconductance coefficient are outside of the operating frequency band 170 of the LNA 100, and are substantially rejected by the output impedance tank circuit 130 of the LNA 100. Thus, these unwanted components $2\psi_1$, $2\psi_2$, $\psi_1 - \psi_2$, and $\psi_1 + \psi_2$ are not substantially present in the output RF signal $V_{out}$. However, the frequency components $2\psi_1 - \psi_2$ and $2\psi_2 - \psi_1$ due to the $g_3$ transconductance coefficient (e.g., the third-order intermodulation components (IMD3)), are within the operating frequency band 170 of the LNA 100. Thus, these unwanted components $2\psi_1 - \psi_2$ and $2\psi_2 - \psi_1$ are not rejected by the tank circuit in the output impedance circuit; and therefore, are present in the output RF signal $V_{out}$, which produces third-order intermodulation distortion.

At low power levels of the input RF signal $V_{in}$, the fundamental components $\psi_1$ and $\psi_2$ may have a magnitude much greater than the third-order intermodulation components $2\psi_1 - \psi_2$ and $2\psi_2 - \psi_1$ in the output RF signal $V_{out}$. However, as the power level of the input RF signal $V_{in}$ is increased, the magnitude of the third-order intermodulation components $2\psi_1 - \psi_2$ and $2\psi_2 - \psi_1$ increases by a factor of three (3) as compared to the fundamental components $\psi_1$ and $\psi_2$, which increase by a factor of one (1). That is, for every 1 dB increase in the input RF signal $V_{in}$, the power level of the third-order intermodulation components $2\psi_1 - \psi_2$ and $2\psi_2 - \psi_1$ increases by three (3) dB, whereas the power level of the fundamentals $\psi_1$ and $\psi_2$ increase by one (1) dB. At a particular power level of the input RF signal $V_{in}$, the power levels of the third-order intermodulation components $2\psi_1 - \psi_2$ and $2\psi_2 - \psi_1$ and the fundamentals $\psi_1$ and $\psi_2$ in the output RF signal $V_{out}$ are theoretically the same. This is termed in the relevant art as the third-order intercept point (IIP3). The higher the IIP3, the better linearity for the LNA 100, and the lesser distortion due to the third-order intermodulation components (IMD3).

Figure 2A:
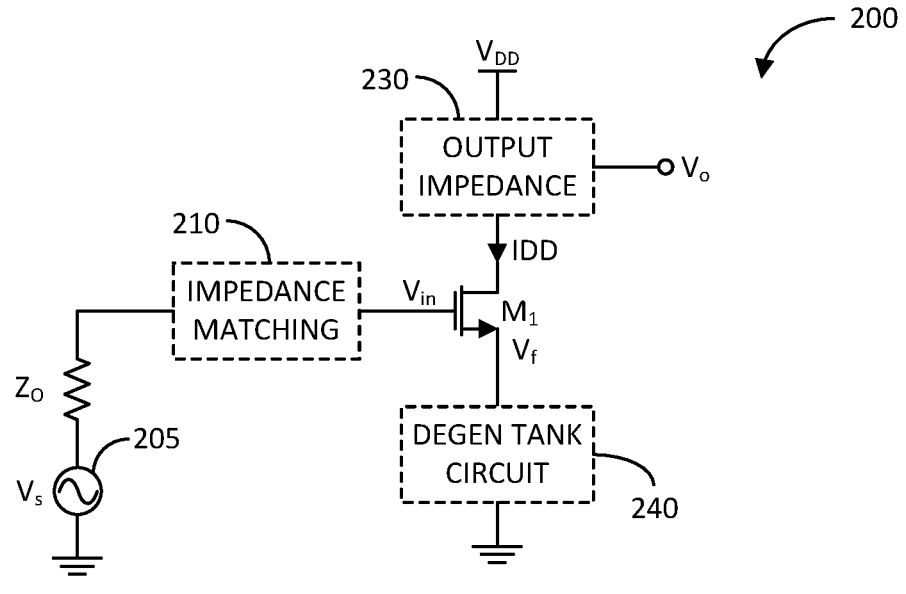
FIG. 2A illustrates a block diagram of another example low noise amplifier (LNA) in accordance with another aspect of the disclosure.

FIG. 2A illustrates a block diagram of another example low noise amplifier (LNA) 200 in accordance with another aspect of the disclosure. As discussed in more detail further herein, the LNA 200 further includes a degeneration resonant or tank circuit coupled between the transistor $M_1$ and the lower voltage rail (e.g., ground). The degeneration tank circuit is tuned to have a maximum resonance impedance at substantially twice the in-band frequencies; e.g., one, or the other, or in between the fundamental components $\psi_1$ and $\psi_2$ (e.g., at $2\psi_1$, $2\psi_2$, or $\psi_1 + \psi_2$).

Accordingly, the second order components $2\psi_1$ and $2\psi_2$ are present at the source of the NMOS FET $M_1$, which combine with the fundamental components $\psi_1$ and $\psi_2$ at the drain of the NMOS FET $M_1$ due to the $g_2$ transconductance coefficient to produce frequency components $2\psi_1 - \psi_2$ and $2\psi_2 - \psi_1$ in the output RF signal $V_{out}$, which are referred to herein as $g_2\{2\psi_1 - \psi_2\}$ and $g_2\{2\psi_2 - \psi_1\}$ components. These components $g_2\{2\psi_1 - \psi_2\}$ and $g_2\{2\psi_2 - \psi_1\}$ are separate from the intrinsic third-order intermodulation components $2\psi_1 - \psi_2$ and $2\psi_2 - \psi_1$ produced by the $g_3$ transconductance coefficient as previously discussed, and are referred to hereinafter as $g_3\{2\psi_1 - \psi_2\}$ and $g_3\{2\psi_2 - \psi_1\}$. By configuring the degeneration tank circuit such that the $g_2\{2\psi_1 - \psi_2\}$ and $g_2\{2\psi_2 - \psi_1\}$ have magnitude and phase substantially equal to and opposite the magnitude and phase of the $g_3\{2\psi_1 - \psi_2\}$ and $g_3\{2\psi_2 - \psi_1\}$, the third-order intermodulation components (IMD3) may be substantially cancelled out in the output RF signal $V_{out}$. Accordingly, the $g_2\{2\psi_1 - \psi_2\}$ and $g_2\{2\psi_2 - \psi_1\}$ may be referred to herein as third-order intermodulation cancellation components.

More specifically, the LNA 200 is similar to the LNA 100 previously discussed, including a transistor $M_1$ (e.g., FET, NMOS FET, PMOS FET, BJT, etc.), and an input impedance matching circuit 210 configured to substantially match an intrinsic impedance $Z_o$ of an RF signal source 205 to the impedance of the control input or gate (base if $M_1$ is a BJT) of the NMOS FET $M_1$. Further, the LNA 200 includes an output impedance or load circuit 230 coupled in series with the NMOS FET $M_1$ and a degeneration tank (resonant) circuit 240 between an upper voltage rail $V_{DD}$ and the lower voltage rail (e.g., ground). As previously discussed, the output impedance circuit 230 may be configured as a resonant or tank circuit to produce an output RF signal $V_{out}$ based on an input RF signal within an operating frequency band set by, for example, a 3 dB bandwidth of the tank circuit.

For the purpose of third-order intermodulation component (IMD3) cancellation, as discussed, the LNA 200 further includes the degeneration tank (resonant) circuit 240 coupled between the NMOS FET $M_1$ and the lower voltage rail (e.g., ground). The degeneration tank circuit 240 is tuned to present a maximum resonance impedance at the source of the NMOS FET $M_1$ at a frequency within twice the operating frequency band of the LNA 200. As an example, if the operating frequency band of the LNA 200 has a center frequency of 2.5 gigaHertz (GHz), the degeneration tank circuit 240 may be tuned to present a maximum resonance impedance at substantially twice the center frequency 5 GHz or at a frequency within twice the operating frequency band (e.g., within 4.8-5.2 GHz if the operating frequency band is 2.4-2.6 GHz).

As the current IDD through the NMOS FET $M_1$ includes all the transconductance frequency components (e.g., $\psi_1$, $\psi_2$, $2\psi_1$, $2\psi_2$, $\psi_1-\psi_2$, $\psi_1+\psi_2$, $2\psi_1-\psi_2$ and $2\psi_2-\psi_1$), the degeneration tank circuit 240 substantially passes to ground the frequency components $\psi_1$, $\psi_2$, $\psi_1-\psi_2$, $\psi_1+\psi_2$, $2\psi_2$ and $2\psi_2-\psi_1$, and substantially leaves the frequency components $2\psi_1$ and $2\psi_2$ as a feedback RF signal $V_f$ at the source of NMOS FET $M_1$. As the transconductance gain $g_m$ of the NMOS FET $M_1$ responds to the gate-to-source voltage, which is equal to $V_{in}-V_f$, the frequency components $2\psi_1$ and $2\psi_2$ at the source of the NMOS FET $M_1$ combine with the fundamental components $\psi_1$ and $\psi_2$ at the drain of the NMOS FET $M_1$ due to the $g_2$ transconductance coefficient to produce the third-order intermodulation cancellation components $g_2\{2\psi_1-\psi_2\}$ and $g_2\{2\psi_2-\psi_1\}$ in the output RF signal $V_{out}$. The degeneration tank circuit 240 is tuned to set the magnitude and phase of the third-order intermodulation cancellation components $g_2\{2\psi_1-\psi_2\}$ and $g_2\{2\psi_2-\psi_1\}$ to be substantially equal and opposite to the magnitude and phase of the third-order intermodulation components (IMD3) $g_3\{2\psi_1-\psi_2\}$ and $g_3\{2\psi_2-\psi_1\}$, such that cancellation of the third third-order intermodulation components (IMD3) substantially occurs in the output RF signal $V_{out}$.

Figure 2B:
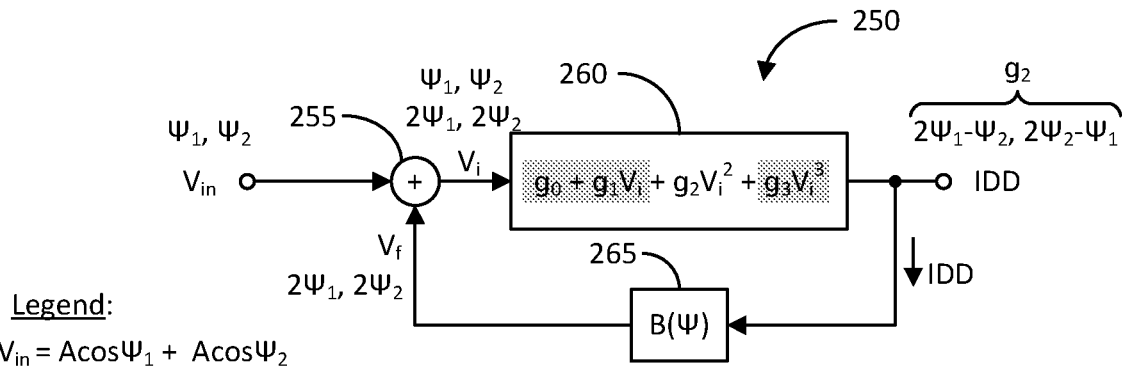
FIG. 2B illustrates a block diagram of an example linearization model of the LNA of FIG. 2A in accordance with another aspect of the disclosure.

FIG. 2B illustrates a block diagram of an example linearization model 250 of the LNA 200 in accordance with another aspect of the disclosure. The linearization model 250 of the LNA 200 includes a transconductance linearization model 260 of the NMOS FET $M_1$, which is the same as the transconductance linearization model 160 previously discussed. Thus, the transconductance linearization model 260 may be characterized by the polynomial specified above in Eq. 1. For third-order intermodulation components (IMD3) cancellation discussion, the focus of the following description is with respect to the $g_2$ coefficient of the polynomial. For this reason, the $g_0$, $g_1$, and $g_3$ coefficient components of the polynomial are shaded in the transconductance linearization model 260, and the $g_2$ coefficient component is not shaded. The linearization model 250 of the LNA 200 further includes a transfer function $\beta(\psi)$ of a degeneration tank circuit 265 (e.g., an example model of the degeneration tank circuit 240) configured to generate the first harmonic components $2\psi_1$ and $2\psi_2$ as a feedback RF signal $V_f$ from the drain current IDD of the NMOS FET $M_1$.

The linearization model 250 of the LNA 200 further includes a summer (or subtractor) 255. The summer 255 sums (or subtracts) a feedback RF signal $V_f$ with (or from) a first input RF signal $V_{in}$ to generate a second input RF signal $V_i$. As an example, the first input RF signal $V_{in}$ may be at the gate of the NMOS FET $M_1$, the feedback RF signal $V_f$ may be at the source of the NMOS FET $M_1$, and the second input RF signal $V_i$ may be the gate-to-source voltage ($V_{gs}$) of the NMOS FET $M_1$. As illustrated, the first input RF signal $V_{in}$ includes the fundamental components $\psi_1$ and $\psi_2$, the feedback RF signal $V_f$ includes the first harmonics of the fundamental components $2\psi_1$ and $2\psi_2$, and the second input RF signal $V_i$ includes the fundamental and first harmonic components $\psi_1$, $\psi_2$, $2\psi_1$ and $2\psi_2$.

As discussed, for third-order intermodulation cancellation (IMD3) discussion, the focus on the discussion is on the $g_2V_i^2$ term of the polynomial of the linearization model 260 of the NMOS FET $M_1$. The $g_2V_i^2$ term of the linearization model 260 causes a mixing of the fundamental components $\psi_1$ and $\psi_2$ with the first harmonic components $2\psi_1$ and $2\psi_2$ to generate $g_2$ coefficient-generated third-order intermodulation cancellation components $g_2\{2\psi_1-\psi_2\}$ and $g_2\{2\psi_2-\psi_1\}$ in the output RF signal $V_{out}$. The output RF signal $V_{out}$ also includes the intrinsic third-order intermodulation components $g_3\{2\psi_1-\psi_2\}$ and $g_3\{2\psi_2-\psi_1\}$. The transfer function $\beta(\psi)$ of the degeneration tank circuit 265 may be configured to set the magnitude and phase of the $g_2$ coefficient-generated third-order intermodulation cancellation components $g_2\{2\psi_1-\psi_2\}$ and $g_2\{2\psi_2-\psi_1\}$ substantially equal and opposite to the magnitude and phase of the third-order intermodulation components $g_3\{2\psi_1-\psi_2\}$ and $g_3\{2\psi_2-\psi_1\}$; thereby substantially cancelling out the third-order intermodulation components (IMD3) from the output RF voltage $V_{out}$.

Figure 2C:
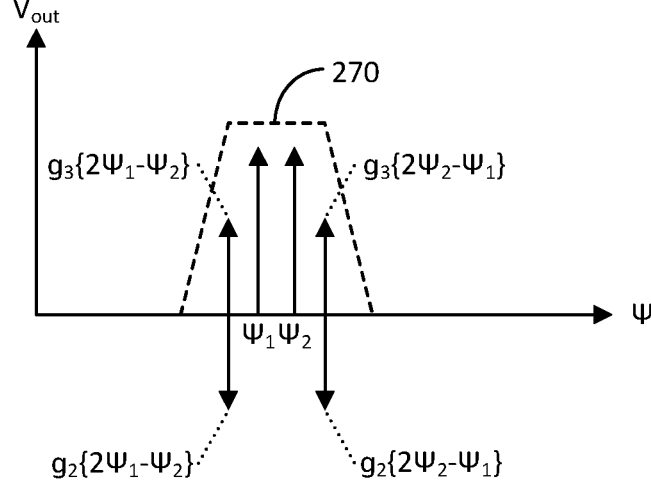
FIG. 2C illustrates a graph depicting example frequency components at a drain terminal of a field effect transistor (FET) of the LNA of FIG. 2A in accordance with another aspect of the disclosure.

FIG. 2C illustrates a graph depicting an example frequency components at the output of the LNA 200 in accordance with another aspect of the disclosure. Similar to the graph of FIG. 1C, the horizontal axis represents frequency in terms of ib. The vertical axis represents the magnitude of the output RF signal $V_{out}$ of the LNA 200. The graph depicts the operating frequency band 270 of the LNA 200, depicted as a dashed trapezoid. As previously discussed, the output impedance circuit 230 may be implemented as a tank (resonant) circuit to set the 3 dB bandwidth (BW) 270 of the output RF signal $V_{out}$.

The graph further depicts the desirable fundamental components $\psi_1$ and $\psi_2$ of the output RF signal $V_{out}$, which lies within the operating frequency band 270 of the LNA 200. Additionally, the graph depicts the third-order intermodulation components (IMD3) $g_3\{2\psi_1-\psi_2\}$ and $g_3\{2\psi_2-\psi_1\}$ also lying within the operating frequency band 270 of the LNA 200. Additionally, due to the degeneration tank circuit 240, the graph depicts the $g_2$ coefficient-generated third-order intermodulation cancellation components $g_2\{2\psi_1-\psi_2\}$ and $g_2\{2\psi_2-\psi_1\}$. As shown, the $g_2$ coefficient-generated third-order intermodulation cancellation components $g_2\{2\psi_1-\psi_2\}$ and $g_2\{2\psi_2-\psi_1\}$ have a magnitude and phase substantially equal and opposite to the magnitude and phase of the third-order intermodulation components (IMD3) $g_3\{2\psi_1-\psi_2\}$ and $g_3\{2\psi_2-\psi_1\}$. Thus, these frequency components substantially cancel; resulting in the output RF signal $V_{out}$ including substantially only the desired fundamental components $\psi_1$ and $\psi_2$.

Figure 3:
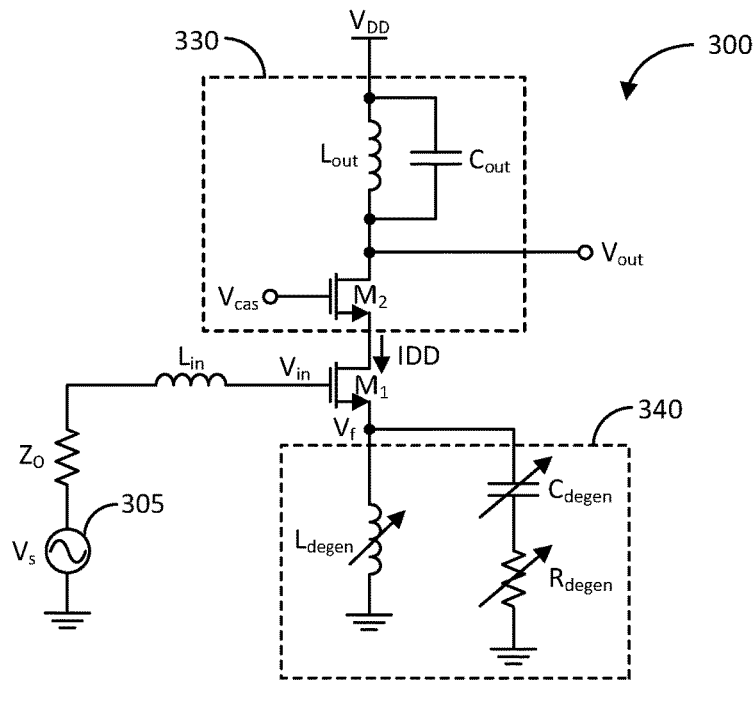
FIG. 3 illustrates a block diagram of another example low noise amplifier (LNA) in accordance with another aspect of the disclosure.

FIG. 3 illustrates a block diagram of another example low noise amplifier (LNA) 300 in accordance with another aspect of the disclosure. The LNA 300 may be an exemplary detailed implementation of the LNA 200 previously discussed.

The LNA 300 includes a transistor $M_1$, which may be implemented as a FET, NMOS FET, or BJT. The LNA 300 further includes an input impedance matching circuit including an input inductor $L_{in}$ coupled in series between an RF signal source 305 (e.g., at least one antenna and associated circuitry) having an intrinsic impedance $Z_o$ and a control input (e.g., gate or base) of the transistor $M_1$ (referred to hereinafter as NMOS FET $M_1$ for ease of description). The input inductor $L_{in}$ is configured to improve the impedance matching between the intrinsic impedance $Z_o$ of the RF signal source 305 and the gate of the NMOS FET $M_1$ (e.g., providing a minimum return loss within the operating frequency band of the LNA 300).

The LNA 300 further includes an output impedance or load circuit 330 and a degeneration tank circuit 340. The output impedance circuit 330, the NMOS FET $M_1$, and the degeneration tank circuit 340 are coupled in series between an upper voltage rail $V_{DD}$ and a lower voltage rail (e.g., ground). The output impedance circuit 330 includes a tank (e.g., parallel L-C resonant) circuit including output inductor $L_{out}$ coupled in parallel with output capacitor $C_{out}$ between the upper voltage rail $V_{DD}$ and a cascode transistor $M_2$. The tank circuit $L_{out}$-$C_{out}$ is configured to be tuned to an operating frequency band $f_c \pm BW/2$ of the LNA 300. The cascode transistor $M_2$ is configured to increase the output impedance, and may be implemented as a FET, NMOS FET or BJT, and includes a control input (e.g., gate or base) configured to receive a cascode bias voltage $V_{cas}$. It shall be understood that the cascode transistor $M_2$ may be optional, or alternatively, the output impedance circuit 330 may include a plurality of cascode transistor stages to increase the output impedance as desired.

For third-order intermodulation distortion cancellation, the degeneration tank circuit 340 is configured to be tuned such that it presents a maximum resonance impedance at the source or emitter of transistor $M_1$ at twice the in-band frequency of the operating band $f_c \pm BW/2$ of the LNA 300 (e.g., within $2f_c \pm 2BW$). However, for improved third-order intermodulation distortion cancellation, the degeneration tank circuit 340 may be tuned to present a maximum resonance impedance at substantially twice the center frequency $f_c$ of the operating frequency band of the LNA 300 (e.g., at substantially $2f_c$). In this configuration, the degeneration tank circuit 340 substantially passes to ground the frequency components $\psi_1$, $\psi_2$, $\psi_1$-$\psi_2$, $\psi_1$+$\psi_2$, $2\psi_1$-$\psi_2$ and $2\psi_2$-$\psi_1$ of the drain current IDD of the NMOS FET $M_1$, and substantially leaves the frequency components $2\psi_1$ and $2\psi_2$ of the drain current IDD as a feedback RF signal $V_f$ at the source or emitter of transistor $M_1$.

The degeneration tank circuit 340 includes a degeneration inductor Lang, a degeneration capacitor $C_{degen}$, and a degeneration resistor $R_{degen}$. The degeneration inductor Lang, which may be configured to have a variable inductance, is coupled between the source of the NMOS FET $M_1$ and the lower voltage rail (e.g., ground). The degeneration capacitor $C_{degen}$ and the degeneration resistor Range, both of which may be configured to have variable capacitance and variable resistance, respectively, are coupled in series between the source of the NMOS FET $M_1$ and the lower voltage rail (e.g., ground). In some implementations, the degeneration inductor $L_{degen}$ may be one or more fixed inductors while the degeneration capacitor $C_{degen}$, and the degeneration resistor $R_{degen}$ may be variable.

As previously discussed, the degeneration tank circuit 340 is configured to generate a feedback RF signal $V_f$ at the source of the NMOS FET $M_1$. The feedback RF signal $V_f$ includes the first harmonics $2\psi_1$ and $2\psi_2$ of the in-band fundamental components $\psi_1$ and $\psi_2$ of the input RF signal $V_{in}$. As previously discussed, the gate-to-source voltage of the NMOS FET $M_1$ is referred to herein as $V_{in}$ The drain current IDD of the NMOS FET $M_1$ may be given by gin*$V_{in}$ The output RF signal $V_{out}$ is based on the drain current IDD of the NMOS FET $M_1$ being filtered by an output tank circuit. Because the gate-to-source voltage $V_i$ is a combination (sum or difference) of the input RF signal $V_{in}$, which includes the fundamental components $\psi_1$ and $\psi_2$, and the feedback RF signal $V_f$, which includes the first harmonic components $2\psi_1$ and $2\psi_2$ the $g_2 V_i^2$ component of the transconductance $g_m$ of the NMOS FET $M_1$ generate the $g_2$ coefficient-generated third-order intermodulation cancellation components $g_2\{2\psi_1-\psi_2\}$ and $g_2\{2\psi_2-\psi_1\}$ in the output RF signal $V_{out}$. Also, as discussed, the output RF signal Vint also includes the intrinsic third-order intermodulation distortion components $g_3\{2\psi_1-\psi_2\}$ and $g_3\{2\psi_2-\psi_1\}$.

The degeneration tank circuit 340 is tuned to set the magnitude and phase of the third-order intermodulation cancellation components $g_2\{2\psi_1-\psi_2\}$ and $g_2\{2\psi_2-\psi_1\}$ to be substantially equal and opposite to the magnitude and phase of the third-order intermodulation components (IMD3) $g_3\{2\psi_1-\psi_2\}$ and $g_3\{2\psi_2-\psi_1\}$, such that cancellation of the third third-order intermodulation components (IMD3) substantially occur in the output RF signal $V_{out}$. More specifically, the variable inductor $L_{degen}$ and capacitor $C_{degen}$ may be set so that the phase of $g_2\{2\psi_1-\psi_2\}$ and $g_2\{2\psi_2-\psi_1\}$ is substantially opposite (180 degrees out-of-phase) to the phase of the $g_3\{2\psi_1-\psi_2\}$ and $g_3\{2\psi_2\psi_1\}$. The variable resistor $R_{degen}$ affects the quality factor (Q) of the degeneration tank circuit 340, and may be set to control the magnitude of $g_2\{2\psi_1-\psi_2\}$ and $g_2\{2\psi_2-\psi_1\}$ such that they are substantially equal to the magnitude of $g_3\{2\psi_1-\psi_2\}$ and $g_3\{2\psi_2-\psi_1\}$.

Also, in certain gain modes, such as higher gain modes G1-G3, where the gain of the LNA 300 is 13 dB or greater, it may not be desirable to have the degeneration tank circuit 340 present, as it may impact the noise figure (NF) and gain of the LNA 300. In this regard, the degeneration tank circuit 340 may be disabled by, for example, setting the resistance of the degeneration resistor $R_{degen}$ to substantially infinity or as an open circuit. This effectively removes the degeneration capacitor $C_{degen}$ from the LNA 300. Additionally, the inductance of the variable inductor $L_{degen}$ may be increased to reduce the impedance at the source of the NMOS FET $M_1$ so that higher gain for the LNA 300 may be achieved.

Figure 4A:
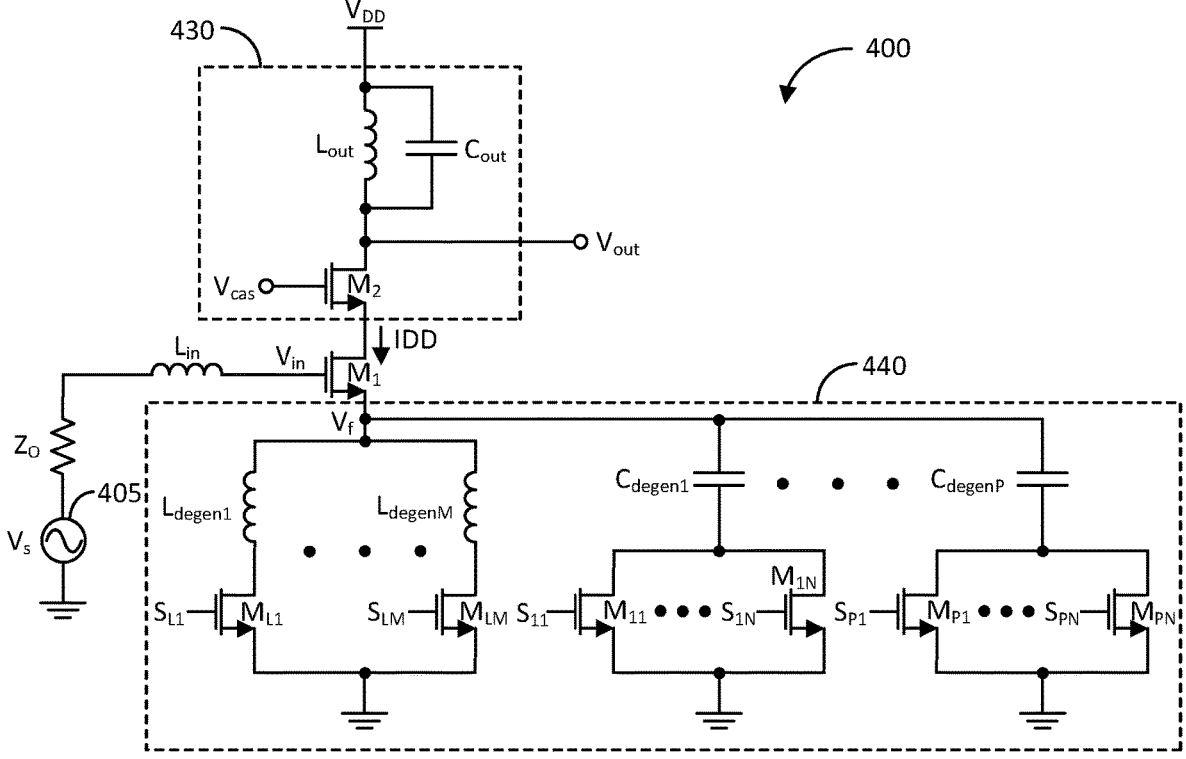
FIG. 4A illustrates a block diagram of another example low noise amplifier (LNA) in accordance with another aspect of the disclosure.

FIG. 4A illustrates a block diagram of another example low noise amplifier (LNA) 400 in accordance with another aspect of the disclosure. The LNA 400 may be another exemplary detailed implementation of the LNA 200 previously discussed.

The LNA 400 includes a transistor $M_1$, which may be implemented as a FET, NMOS FET, PMOS FET, BJT, or the like. The LNA 400 further includes an input impedance matching circuit including input inductor $L_{in}$ coupled in series between an RF signal source 405 (e.g., at least one antenna and associated circuitry) and the gate of the NMOS FET $M_1$. The input inductor $L_{in}$ is configured to improve the impedance matching between an intrinsic impedance Zn of the RF signal source 405 and the control input or gate of the NMOS FET $M_1$.

The LNA 400 further includes an output impedance or load circuit 430 and a degeneration tank circuit 440. The output impedance circuit 430, the NMOS FET $M_1$, and the degeneration tank circuit 440 are coupled in series between an upper voltage rail $V_{DD}$ and a lower voltage rail (e.g., ground). The output impedance circuit 430 includes a tank (e.g., a parallel L-C resonant) circuit including an output inductor Linn coupled in parallel with an output capacitor $C_{out}$ between the upper voltage rail $V_{DD}$ and a cascode transistor $M_2$ (e.g., FET, NMOS FET, or BJT). The output tank circuit $L_{out}$-$C_{out}$ is configured to be tuned to an operating frequency band $f_c{\pm}BW/2$ of the LNA 400. The cascode NMOS FET $M_2$ is configured to increase the output impedance, and includes a control input or gate configured to receive a cascode bias voltage $V_{cas}$. It shall be understood that the cascode NMOS FET $M_2$ is optional; or alternatively, the output impedance circuit 430 may include a plurality of cascode transistor stages to increase the output impedance as desired.

For third-order intermodulation distortion cancellation, the degeneration tank circuit 440 is configured to be tuned such that it presents a maximum resonance impedance at the source of the NMOS FET $M_1$ at substantially twice the in-band frequency of the operating band $f_c{\pm}BW/2$ of the LNA 400 (e.g., within $2f_c{\pm}2BW$). For improved third-order intermodulation distortion cancellation, the degeneration tank circuit 440 may be tuned to present a maximum resonance impedance at substantially twice the center frequency $f_c$ of the operating frequency band of the LNA 400 (e.g., at substantially $2f_c$). In this configuration, the degeneration tank circuit 440 substantially passes to ground the frequency components $\psi_1$, $\psi_2$, $\psi_1{-}\psi_2$, $\psi_1{+}\psi_2$, $2\psi_1{-}\psi_2$ and $2\psi_2{-}\psi_1$ of the drain current IDD of the NMOS FET $M_1$, and substantially leaves the frequency components $2\psi_1$ and $2\psi_2$ of the drain current IDD as a feedback RF signal $V_f$ at the source of the NMOS FET $M_1$.

The degeneration tank circuit 440 includes a variable degeneration inductor implemented as a set of fixed inductors $L_{degen1}$ to $L_{degenM}$ coupled in series with a set of switching devices $M_{L1}$ to $M_{LM}$ between the source of the NMOS FET $M_1$ and the lower voltage rail (e.g., ground), respectively. Each of the set of switching devices $M_{L1}$ to $M_{LM}$ may be implemented as a FET, or more specifically, an NMOS FET. The set of NMOS FETs $M_{L1}$ to $M_{LM}$ include gates configured to receive a set of select signals $S_{L1}$ to $S_{LM}$, respectively. If one or more of the select signals $S_{L1}$ to $S_{LM}$ turn on one or more of the NMOS FETs $M_{L1}$ to $M_{LM}$ (e.g., by being at a high logic state), then one of more of the inductors $L_{degen1}$ to $L_{degen1}$ are coupled between the source of the NMOS FET $M_1$ and the lower voltage rail (e.g., ground), respectively. Conversely, if one or more of the select signals $S_{L1}$ to $S_{LM}$ turn off one or more of the NMOS FETs $M_{L1}$ to $M_{LM}$ (e.g., by being at a low logic state), then one of more of the inductors $L_{degen1}$ to $L_{degenM}$ are effectively decoupled or removed from the LNA 400, respectively.

The degeneration tank circuit 440 further includes a variable degeneration capacitor and a variable degeneration resistor implemented as a set of fixed capacitors $C_{degen1}$ to $C_{degenM}$ coupled in series with a set of parallel switching device banks $M_{11}$ to $M_{1N}$ to $M_{P1}$ to $M_{PN}$ between the source of the NMOS FET $M_1$ and the lower voltage rail (e.g., ground), respectively. Each of the switching devices $M_{11}$ to $M_{1N}$ to $M_{P1}$ to $M_{PN}$ may be implemented as a FET, or more specifically, an NMOS FET. The set of parallel transistor banks $M_{11}$ to $M_{1N}$ to $M_{P1}$ to $M_{PN}$ include control inputs or gates configured to receive sets of select signals $S_{11}$ to $S_{1N}$ to $S_{P1}$ to $S_{PN}$, respectively.

The number of turned-on NMOS FETs in each bank controls the resistance of the degeneration resistor in the corresponding bank. The resistance being the turned-on parallel resistance of the turned-on NMOS FETs per each bank. If at least one NMOS FET in a bank is turned on based on the logic states of the corresponding select signals $S_{11}$ to $S_{1N}$ to $S_{P1}$ to $S_{PN}$ (e.g., high—turning on, low—turning off), the corresponding capacitor $C_{degen}$ with the resistance of the at least one turned-on NMOS FET is coupled between the source of the NMOS FET $M_1$ and the lower voltage rail (e.g., ground). If all the NMOS FETs are turned off in a bank based on the logic states of the corresponding select signals $S_{11}$ to $S_{1N}$ to $S_{P1}$ to $S_{PN}$ (e.g., low—turning off), the corresponding capacitor $C_{degen}$ coupled in series with the bank is effectively decoupled or removed from the LNA 400.

As previously discussed, the degeneration tank circuit 440 is configured to generate a feedback RF signal $V_f$ at the source of the NMOS FET $M_1$. The feedback RF signal $V_f$ includes the first harmonics $2\psi_1$ and $2\psi_2$ of the in-band fundamental components $\psi_1$ and $\psi_2$ of the input RF signal $V_{in}$. As previously discussed, the gate-to-source voltage of the NMOS FET $M_1$ is referred to herein as $V_{in}$. The drain current IDD of the NMOS FET $M_1$ may be given by $g_m*V_{in}$. The output RF signal $V_{out}$ is based on the drain current IDD of the NMOS FET $M_1$. Because the gate-to-source voltage $V_i$ is a combination (sum or difference) of the input RF signal $V_{in}$, which includes the fundamental components $\psi_1$ and $\psi_2$, and the feedback RF signal $V_f$, which includes the first harmonic components $2\psi_1$ and $2\psi_2$, the $g_2V_i^2$ component of the transconductance $g_m$ of the NMOS FET $M_1$ generates the $g_2$ coefficient-generated third-order intermodulation cancellation components $g_2\{2\psi_1{-}\psi_2\}$ and $g_2\{2\psi_2{-}\psi_1\}$ in the output RF signal $V_{out}$. Also, as discussed, the output RF signal $V_{out}$ includes the intrinsic third-order intermodulation distortion components $g_3\{2\psi_1{-}\psi_2\}$ and $g_3\{2\psi_2{-}\psi_1\}$.

The degeneration tank circuit 440 is tuned to set the magnitude and phase of the third-order intermodulation cancellation components $g_2\{2\psi_1{-}\psi_2\}$ and $g_2\{2\psi_2{-}\psi_1\}$ to be substantially equal and opposite to the magnitude and phase of the third-order intermodulation components (IMD3) $g_3\{2 \psi_1{-}\psi_2\}$ and $g_3\{2\psi_2{-}\psi_1\}$, respectively, such that cancellation of the third third-order intermodulation components (IMD3) substantially occur in the output RF signal $V_{out}$. More specifically, the set of select signals $S_{L1}$ to $S_{LM}$ and $S_{11}$-$S_{1N}$ to $S_{P1}$-$S_{PN}$ may be set to control the inductance, capacitance, and resistance of the variable inductor $L_{degen}$, capacitor $C_{degen}$, and resistor $R_{degen}$ so that the magnitude and phase of $g_2\{2\psi_1{-}\psi_2\}$ and $g_2\{2\psi_2{-}\psi_1\}$ is substantially equal and opposite (180 degrees out-of-phase) to the magnitude and phase of the $g_3\{2\psi_1{-}\psi_2\}$ and $g_3\{2\psi_2{-}\psi_1\}$.

Also, as previously discussed, in certain gain modes, such as higher gain modes G1-G3 where the gain of the LNA 400 is 13 dB or greater, it may not be desirable to have the degeneration tank circuit 440 present, as it may impact the NF and gain of the LNA 400. In this regard, the degeneration tank circuit 440 may be disabled by, for example, setting the select signals $S_{11}$-$S_{1N}$ to $S_{P1}$-$S_{PN}$ to turn off NMOS FETs $M_{11}$-$M_{1N}$ to $M_{P1}$-$M_{PN}$ (e.g., setting the select signals to low logic states). This effectively removes the degeneration capacitors $C_{degen1}$ to $C_{degenP}$ from the LNA 400. Additionally, the inductance of the variable inductor $L_{degen}$ may be increased by setting the select signals $S_{L1}$-$S_{LM}$ to turn on more of the NMOS FETs $M_{L1}$ to $M_{LM}$, respectively.

Figure 4B:
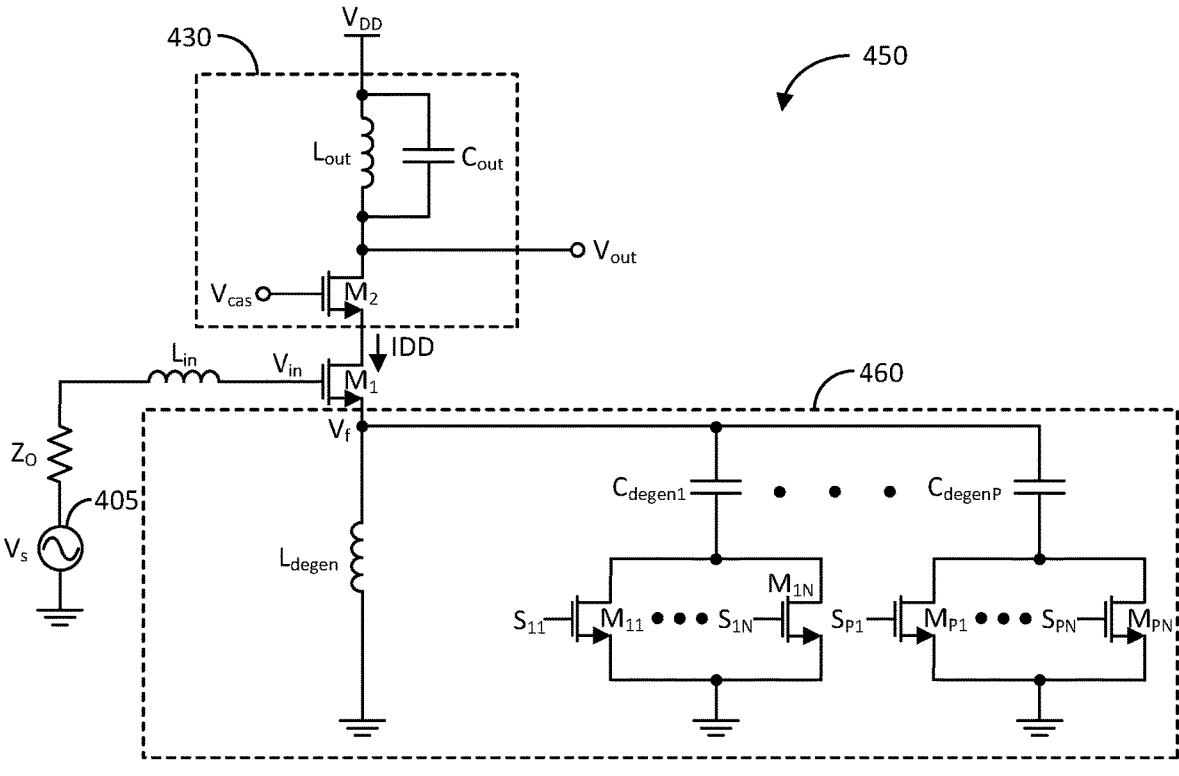
FIG. 4B illustrates a block diagram of another example low noise amplifier (LNA) in accordance with another aspect of the disclosure.

FIG. 4B illustrates a block diagram of another example low noise amplifier (LNA) 450 in accordance with another aspect of the disclosure. The LNA 450 is a variation of LNA 400, and includes many of the same elements as indicated by the same reference numbers and labels. The LNA 450 differs from LNA 400 in that LNA 450 includes a degeneration tank circuit 460 that includes a fixed inductor $L_{degen}$ coupled in parallel with a variable capacitor device $C_{degen1}$ to $C_{degenP}$ and a variable resistor device $M_{11}$-$M_{1N}$ to $M_{P1}$ to $M_{PN}$.

FIG. 5 illustrates a flow diagram of an example method 500 of reducing a third-order intermodulation component from an output of a low noise amplifier (LNA) in accordance with another aspect of the disclosure.

The method 500 includes receiving an input radio frequency (RF) signal cycling with a first frequency at a control terminal of the transistor (block 510). Examples of means for receiving an input radio frequency (RF) signal cycling with a first frequency at a control terminal of the transistor include any of the input impedance matching circuits 210, and input series inductor Lm.

Additionally, the method 500 includes generating a feedback RF signal cycling at a second frequency at a second terminal of the transistor, wherein the second frequency is substantially twice the first frequency (block 520). Examples of means for generating a feedback RF signal cycling at a second frequency at a second terminal of the transistor, wherein the second frequency is substantially twice the first frequency include any of the degeneration tank circuits 240, 270, 340, 440, and 460.

Further, the method 500 includes generating a third-order intermodulation cancellation component at the first terminal including combining the input RF signal with the feedback signal, wherein the third-order intermodulation cancellation component has a magnitude and phase substantially equal to and opposite magnitude and phase of the third-order intermodulation component at the first terminal of the transistor, respectively (block 530). Examples of means for generating a third-order intermodulation cancellation component at the first terminal including combining the input RF signal with the feedback signal, wherein the third-order intermodulation cancellation component has a magnitude and phase substantially equal to and opposite a magnitude and phase of the third-order intermodulation component at the first terminal of the transistor include the transconductance gain ($g_m$) of any of the transistors $M_1$ or linearization model 260 thereof.

Figure 6:
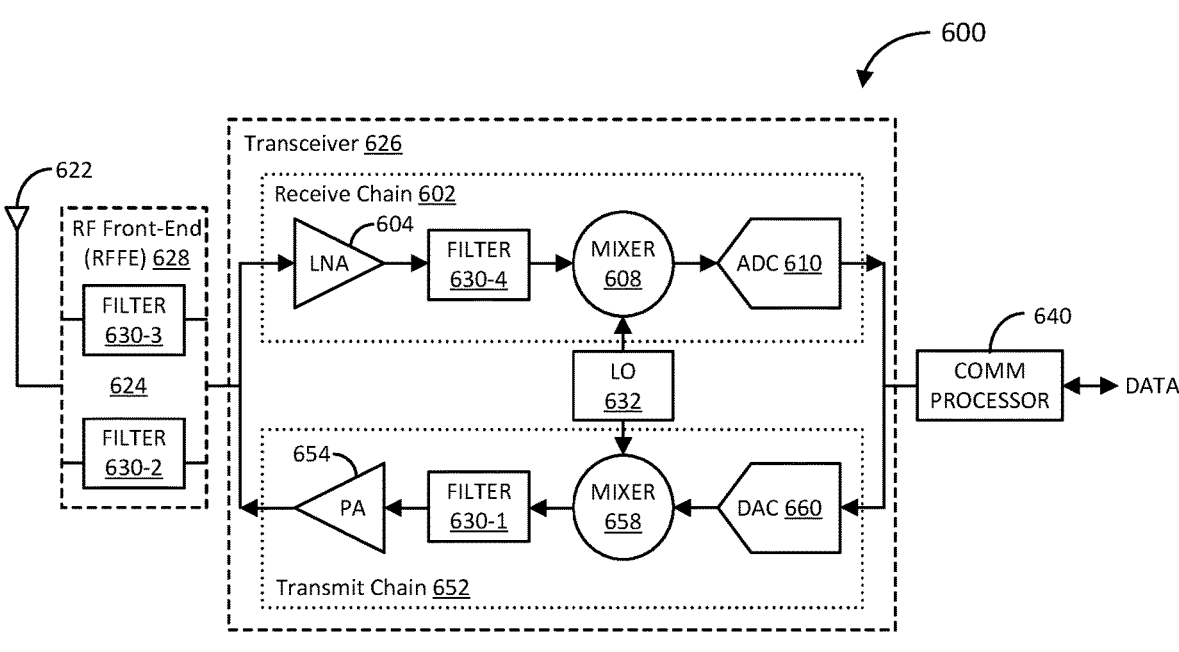
FIG. 6 illustrates a block diagram of an example wireless communication device including an example transceiver and an example radio frequency (RF) front-end in accordance with another aspect of the disclosure.

FIG. 6 illustrates a block diagram of an example wireless communication device 600 including a transceiver 626 and an example RF front-end 628 in accordance with another aspect of the disclosure. FIG. 6 also depicts an antenna 622 and a communication processor 640. The communication processor 640 communicates one or more data signals to other components, such as the application processor, for further processing of data (e.g., for processing at an application level). As shown, the wireless communication device 600 may include a filter circuit 630-1, a filter circuit 630-2, a filter circuit 630-3, or a filter circuit 630-4. It shall be understood that the wireless communication device 600 may include a different quantity of filters (e.g., more or fewer), may include filters that are coupled together differently, may include filters in different locations, and so forth.

As illustrated from left to right, in example implementations, the antenna 622 is coupled to the RF front-end 628, and the RF front-end 628 is coupled to the transceiver 626. The transceiver 626 is coupled to the communication processor 640. The example RF front-end 628 includes at least one signal propagation path 624. The at least one signal propagation path 624 may include at least one filter circuit, such as the filter circuit 630-2 and the filter circuit 630-3. The example transceiver 626 includes at least one receive chain 602 (or receive path 602) and at least one transmit chain 652 (or transmit path 652). Although only one RF front-end 628, one transceiver 626, and one communication processor 640 are shown, the wireless communication device 600 may include multiple instances of any or all such components. Also, although only certain components are explicitly depicted in FIG. 6 and are shown coupled together in a particular manner, the transceiver 626 or the RF front-end 628 may include other non-illustrated components (e.g., switches), more or fewer components, differently coupled arrangements of components, and so forth.

In some implementations, the RF front-end 628 couples the antenna 622 to the transceiver 626 via the signal propagation path 624. In operation, the signal propagation path 624 carries a signal between the antenna 622 and the transceiver 626. During, or as part of the signal propagation, the signal propagation path 624 conditions the propagating signal, such as with the filter circuit 630-2 or the filter circuit 630-3. This enables the RF front-end 628 to couple an RF signal from the antenna 622 to the transceiver 626 as part of a reception operation. The RF front-end 628 also enables a transmission RF signal to be coupled from the transceiver 626 to the antenna 622 as part of a transmission operation to emanate a wireless signal. Although not explicitly shown in FIG. 6, the RF front-end 628, or a signal propagation path 624 thereof, may include one or more other components, such as another filter, an amplifier (e.g., a power amplifier or a low-noise amplifier), an N-plexer, a phase shifter, one or more switches and so forth.

In some implementations, the transceiver 626 may include at least one receive chain 602, at least one transmit chain 652, or at least one receive chain 602 and at least one transmit chain 652. The receive chain 602 may include a low-noise amplifier 604 (LNA 604), the filter circuit 630-4, a mixer 608 for frequency down-conversion, and an ADC 610. The LNA 604 may be implemented per any of the LNAs previously discussed, including LNA 200, 250, 300, 400, and 450. The transmit chain 652 may include a power amplifier 654 (PA 654), the filter circuit 630-1, a mixer 658 for frequency up-conversion, and a DAC 660. However, the receive chain 602 or the transmit chain 652 may include other components; for example, additional amplifiers or filters, multiple mixers, one or more buffers, or at least one local oscillator, that are electrically disposed anywhere along the depicted receive and transmit chains.

The receive chain 602 is coupled between the signal propagation path 624 of the RF front-end 628 and the communication processor 640; e.g., via the low-noise amplifier 604 and the ADC 610, respectively. The transmit chain 652 is coupled between the signal propagation path 624 and the communication processor 640; e.g., via the power amplifier 654 and the DAC 660, respectively. The transceiver 626 can also include at least one local oscillator 632 (LO 632) (e.g., including a phase-locked loop (PLL)) that is coupled to the mixer 608 and/or the mixer 658. For example, the transceiver 626 can include one LO 632 for each transmit/receive chain pair, one LO 632 per transmit chain and one LO 632 per receive chain, multiple LOs 632 per chain, and so forth.

As shown for certain example implementations of the receive chain 602, the antenna 622 is coupled to the low-noise amplifier 604 via the signal propagation path 624 and the filter circuit 630-3 thereof, and the low-noise amplifier 604 is coupled to the filter circuit 630-4. The filter circuit 630-4 is coupled to the mixer 608, and the mixer 658 is coupled to the ADC 610. The ADC 610 is, in turn, coupled to the communication processor 640. As shown for certain example implementations of the transmit chain 652, the communication processor 640 is coupled to the DAC 660, and the DAC 660 is coupled to the mixer 658. The mixer 658 is coupled to the filter circuit 630-1, and the filter circuit 630-1 is coupled to the power amplifier 654. The power amplifier 654 is coupled to the antenna 622 via the signal propagation path 624 using the filter circuit 630-2 thereof. Although only one receive chain 602 and one transmit chain 652 are explicitly shown, the transceiver 626 may include multiple instances of either or both components. Although the ADC 610 and the DAC 660 are illustrated as being separately coupled to the communication processor 640, they may share a bus or other means for communicating with the processor 640.

As part of an example signal-receiving operation, the low-noise amplifier 604 provides an amplified signal to the filter circuit 630-4. The filter circuit 630-4 filters the amplified signal and provides a filtered signal to the mixer 608. The mixer 608 performs a frequency conversion operation on the filtered signal to down-convert from one frequency to a lower frequency (e.g., from a radio frequency (RF) to an intermediate frequency (IF) or to a baseband frequency (BBF)). The mixer 608 may perform the frequency down-conversion in a single conversion step or through multiple conversion steps using at least one LO 632. The mixer 608 may provide a down-converted signal to the ADC 610 for conversion and forwarding to the communication processor 640 as a digital signal.

As part of an example signal-transmitting operation, the mixer 658 accepts an analog signal at BBF or IF from the DAC 660. The mixer 658 upconverts the analog signal to a higher frequency, such as to an RF frequency, to produce an RF signal using a signal generated by the LO 632 to have a target synthesized frequency. The mixer 658 provides the RF signal to the filter circuit 630-1, which filters the signal. After filtering by the filter circuit 630-1, the power amplifier 654 provides an amplified signal to the signal propagation path 624 for signal conditioning. The RF front-end 628 may use, for instance, the filter circuit 630-2 of the signal propagation path 624 to provide a filtered signal to the antenna 622 for emanation as a wireless signal.

The wireless communication device 600 includes just some examples for a transceiver 626 and/or an RF front-end 628. In some cases, the various components that are illustrated in the drawings using separate schematic blocks or circuit elements may be manufactured or packaged in different discrete manners. For example, one physical module may include components of the RF front-end 628 and some components of the transceiver 626, and another physical module may combine the communication processor 640 with the remaining components of the transceiver 626. Further, in some cases, the antenna 622 may be co-packaged with at least some components of the RF front-end 628 or the transceiver 626. In alternative implementations, one or more components may be physically or logically "shifted" to a different part of the wireless communication device 600 and/or may be incorporated into a different module. For example, a low-noise amplifier 604 or a power amplifier 654 may alternatively or additionally be deployed in the RF front-end 628. Examples of this alternative are described next with reference to FIG. 7.

Figure 7:
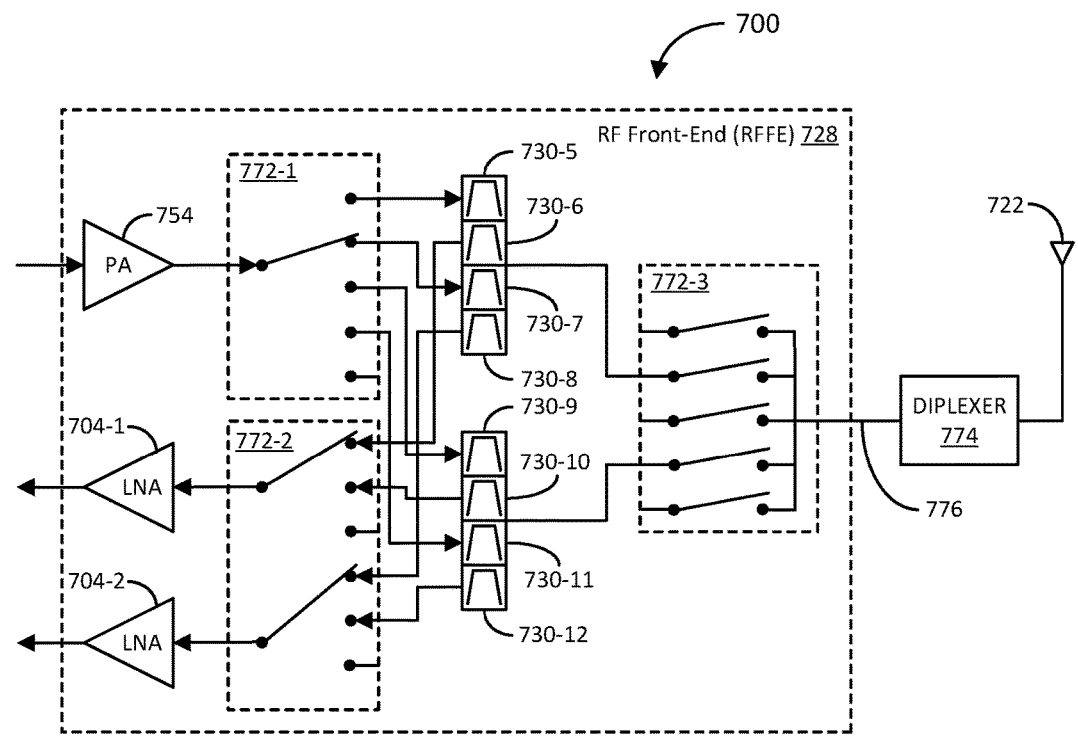
FIG. 7 illustrates a block diagram of another example wireless communication device including an example radio frequency (RF) front-end having one or more low noise amplifiers (LNAs) in accordance with another aspect of the disclosure.

FIG. 7 illustrates a block diagram of an example wireless communication device 700 including an example RF front-end 728 that may include one or more filter circuits coupled to at least one amplifier via a switch. As illustrated, the RF front-end 728 is coupled to an antenna 722 via an antenna feed line 776. Between the RF front-end 728 and the antenna

722, the antenna feed line 776 may include a diplexer 774 (or a duplexer in some implementations where Tx and Rx share the antenna 722). The RF front-end 728 may include a power amplifier (PA) 754, a first low-noise amplifier (LNA) 704-1, and a second low-noise amplifier (LNA) 704-2. One or both of the LNAs 704-1 or 704-2 may be implemented per any of the LNAs previously discussed, including LNA 200, 250, 300, 400, and 450.

The RF front-end 728 may also include multiple switches, such as a first switch 772-1, a second switch 772-2, and a third switch 772-3. The first switch 772-1 is coupled along a transmit path of a signal propagation path 624 (of FIG. 6), and the second switch 772-2 is coupled along a receive path of another signal propagation path 624. Multiple transmit or receive signal propagation paths may be established using the switches.

In example implementations, the RF front-end 728 may further include multiple filter circuits, such as eight filter circuits 730-5 to 730-12. The four filter circuits 730-5, 730-7, 730-9, and 730-11 may be used as part of a transmit path between the power amplifier 754 and the antenna 722, with the transmit path including the antennal feed line 776. The four filter circuits 730-6, 730-8, 630-10, and 730-12 may be used as part of a receive path between the antenna 722 and a low-noise amplifier, such as the first low-noise amplifier 704-1 and the second low-noise amplifier 704-2, which, as discussed, may be implemented per any one of the LNAs 200, 250, 300, 400, and 450. Thus, the four filter circuits 730-5, 730-7, 730-9, and 730-11 can filter a transmit signal that is outputted by the power amplifier 754. The four filter circuits 730-6, 730-8, 730-10, and 730-12 can filter a receive signal before the receive signal is input to the first or second low-noise amplifier 704-1 or 704-2.

The transmit and receive paths can be established using one or more of the first, second, or third switches 772-1, 772-2, or 772-3. The communication processor 640 (of FIG. 6) may position or set the states of these switches based on transmit versus receive mode, a frequency being used for transmission or reception, and so forth. Although certain components are depicted in FIG. 7 in a certain arrangement and described above in a particular manner, the RF front-end 728 may include different components, more or fewer components, different couplings, and so forth.

The following provides an overview of aspects of the present disclosure:

Aspect 1: An amplifier, including: a first transistor; an impedance matching circuit configured to receive an input radio frequency (RF) signal within an operating frequency band of the amplifier, wherein the impedance matching circuit is coupled to a control input of the first transistor; an output impedance circuit configured to generate an output RF signal within the operating frequency band; and a first tank circuit configured to produce a resonance impedance at a first frequency substantially twice a second frequency of the input RF signal, wherein the output impedance circuit, the first transistor, and the first tank circuit are coupled in series between a first voltage rail and a second voltage rail.

Aspect 2: The amplifier of aspect 1, wherein the first tank circuit includes: a resistive device; and a capacitor coupled in series with the resistive device between the first transistor and the second voltage rail.

Aspect 3: The amplifier of aspect 2, wherein the capacitor is configured to have a variable capacitance.

Aspect 4: The amplifier of aspect 2 or 3 wherein the resistive device is configured to have a variable resistance.

Aspect 5: The amplifier of any one of aspects 2-4, wherein the resistive device includes a second transistor.

Aspect 6: The amplifier of any one of aspects 2-5, wherein the resistive device includes a set of parallel transistors, wherein the set of parallel transistors include a set of control inputs configured to receive a set of select signals to control a resistance of the set of parallel transistors, respectively.

Aspect 7: The amplifier of aspect 1, wherein the first tank circuit includes: a set of capacitors; and a set of parallel transistor banks coupled in series with the set of capacitors between the first transistor and the second voltage rail, wherein the set of parallel transistor banks include sets of control inputs configured to receive sets of select signals to control a set of resistances of the set of parallel transistor banks, respectively.

Aspect 8: The amplifier of aspect 1, wherein the first tank circuit includes: a capacitor; a resistive device coupled in series with the capacitor between the first transistor and the second voltage rail; and an inductor coupled in parallel with the capacitor and the resistive device between the first transistor and the second voltage rail.

Aspect 9: The amplifier of aspect 8, wherein: the capacitor is configured to have a variable capacitance; the resistive device is configured to have a variable resistance; and the inductor is configured to have a variable inductance.

Aspect 10: The amplifier of any one of aspects 1-9, wherein: the first tank circuit is configured to produce the resonance impedance at the first frequency substantially twice the second frequency of the input RF signal while the amplifier is operating in a first gain mode; and the first tank circuit is configured to be disabled while the amplifier is operating in a second gain mode.

Aspect 11: The amplifier of aspect 10, wherein the second gain mode is associated with a first gain of the amplifier that is higher than a second gain of the amplifier associated with the first gain mode.

Aspect 12: The amplifier of aspect 10 or 11, wherein the first tank circuit includes: a capacitor; and a variable resistive device coupled in series with the capacitor between the first transistor and the second voltage rail, wherein the variable resistive device is configured to have a first resistance in the second gain mode higher than a second resistance in the first gain mode.

Aspect 13: The amplifier of aspect 12, wherein the first tank circuit further includes a variable inductor coupled in parallel with the capacitor and resistive device between the first transistor and the second voltage rail, wherein the variable inductor is configured with a first inductance in the first gain mode, and configured with a second inductance in the second gain mode, wherein the second inductance is greater than the first inductance.

Aspect 14: The amplifier of any one of aspects 1-13, wherein the output impedance circuit includes a second tank circuit.

Aspect 15: The amplifier of aspect 14, wherein the second tank circuit is configured to produce a three (3) decibel passband substantially coinciding with the operating frequency band of the amplifier.

Aspect 16: The amplifier of aspect 14 or 15, wherein the second tank circuit includes: an inductor; and a capacitor coupled in parallel with the inductor between the first voltage rail and the first transistor.

Aspect 17: The amplifier of any one of aspects 1-16, wherein the output impedance circuit includes at least one cascode transistor.

Aspect 18: The amplifier of any one of aspects 1-17, wherein the impedance matching circuit is configured to produce a minimum return loss within the operating frequency band of the amplifier.

Aspect 19: The amplifier of any one of aspects 1-18, wherein the impedance matching circuit includes a series inductor.

Aspect 20: The amplifier of any one of aspects 1-19, wherein the first transistor includes a field effect transistor (FET), wherein the control input includes a gate of the FET, and wherein the first tank circuit is coupled between a source of the FET and the second voltage rail.

Aspect 21: The amplifier of any one of aspects 1-19, wherein the first transistor includes a bipolar junction transistor (BJT), wherein the control input includes a base of the BJT, and wherein the first tank circuit is coupled between an emitter of the BJT and the second voltage rail.

Aspect 22: A method of reducing a third-order intermodulation component at a first terminal of a transistor, including: receiving an input radio frequency (RF) signal cycling with a first frequency at a control terminal of the transistor; generating a feedback RF signal cycling at a second frequency at a second terminal of the transistor, wherein the second frequency is substantially twice the first frequency; and generating a third-order intermodulation cancellation component at the first terminal including combining the input RF signal with the feedback RF signal, wherein the third-order intermodulation cancellation component has a magnitude and phase substantially equal and opposite to a magnitude and phase of the third-order intermodulation component at the first terminal of the transistor, respectively.

Aspect 23: The method of aspect 22, wherein the third-order intermodulation component is generated based on a third-order component of a transconductance gain of the transistor, and wherein the third-order intermodulation cancellation component is generated based on a second-order component of the transconductance gain of the transistor.

Aspect 24: The method of aspect 22 or 23, wherein generating the feedback RF signal at the second terminal of the transistor includes generating the feedback RF signal via a tank circuit between the second terminal of the transistor and a voltage rail, wherein the tank circuit has a resonance frequency at substantially the second frequency of the feedback RF signal.

Aspect 25: The method of aspect 24, wherein the tank circuit is configured per the first tank circuit specified in any one of aspects 2-13.

Aspect 26: The method of any one of aspects 22-25, further including generating an output RF signal by filtering signals at the first terminal of the transistor.

Aspect 27: The method of aspect 26, wherein filtering signals at the first terminal of the transistor includes using a tank circuit to filter the signals at the first terminal of the transistor.

Aspect 28: The method of aspect 27, wherein the tank circuit is configured per the second tank circuit specified in any one of aspect 15-16.

Aspect 29: The method of any one of aspects 26-28, wherein generating the output RF signal includes increasing an output impedance presented to the first terminal of the transistor using at least one cascode transistor.

Aspect 30: The method of any one of aspects 22-29, further including generating the input RF signal including impedance matching filtering of a source RF signal.

Aspect 31: The method of aspect 30, wherein the impedance matching circuit is configured per the impedance matching circuit specified in any one of claims 18-19.

Aspect 32: The method of any one of aspect 22-31, wherein the transistor includes a field effect transistor (FET).

Aspect 33: The method of any one of aspect 22-31, wherein the transistor includes a bipolar junction transistor (BJT).

Aspect 34: An apparatus of reducing a third-order intermodulation component at a first terminal of a transistor, including: means for receiving an input radio frequency (RF) signal cycling with a first frequency at a control terminal of the transistor; means for generating a feedback RF signal cycling at a second frequency at a second terminal of the transistor, wherein the second frequency is substantially twice the first frequency; and means for generating a third-order intermodulation cancellation component at the first terminal including combining the input RF signal with the feedback RF signal, wherein the third-order intermodulation cancellation component has a magnitude and phase substantially equal to and opposite a magnitude and phase of the third-order intermodulation component at the first terminal of the transistor, respectively.

Aspect 35: A wireless communication device, including: at least one antenna; a transceiver coupled to the at least one antenna, wherein the transceiver includes a low noise amplifier (LNA) including: a first transistor, an impedance matching circuit configured to receive an input radio frequency (RF) signal within an operating frequency band of the LNA, wherein the impedance matching circuit is coupled to a control input of the first transistor, an output impedance circuit configured to generate an output RF signal within the operating frequency band, and a first tank circuit configured to produce a resonance impedance at a frequency substantially twice a frequency of the input RF signal, wherein the output impedance circuit, the first transistor, and the first tank circuit are coupled in series between a first voltage rail and a second voltage rail; and a communication processor coupled to the transceiver.

Aspect 36: An amplifier, comprising: a first transistor having a gate configured to receive an input radio frequency (RF) signal within an operating frequency band of the amplifier; a load circuit coupled between a first voltage rail and a drain of the first transistor and configured to generate an output RF signal within the operating frequency band; and a first tank circuit coupled between a source of the first transistor and a second voltage rail, the first tank circuit comprising an inductor coupled between the source of the first transistor and the second voltage rail, the first tank circuit further comprising a variable capacitor device coupled in series with a variable resistive device, the variable capacitor device and the variable resistive device coupled between the source of the first transistor and the second voltage rail.

Aspect 37: The amplifier of aspect 36, wherein the variable resistive device comprises a set of parallel transistors, wherein the set of parallel transistors include a set of control inputs configured to receive a set of select signals to control a resistance of the set of parallel transistors, respectively.

Aspect 38: The amplifier of aspect 36 or 37, wherein the first tank circuit comprises: a set of capacitors forming at least a portion of the variable capacitive device; and a set of parallel transistor banks forming at least a portion of the variable resistive device and coupled in series with the set of capacitors between the first transistor and the second voltage rail, wherein the set of parallel transistor banks include sets of control inputs configured to receive sets of select signals to control a set of resistances of the set of parallel transistor banks, respectively.

Aspect 39: The amplifier of any one of aspects 36-38, wherein: the first tank circuit is configured to produce a resonance impedance at a first frequency substantially twice a second frequency of the input RF signal while the amplifier is operating in a first gain mode; and the first tank circuit is configured to be disabled while the amplifier is operating in a second gain mode.

Aspect 40: The amplifier of aspect 39, wherein the second gain mode is associated with a first gain of the amplifier that is higher than a second gain of the amplifier associated with the first gain mode.

Aspect 41: The amplifier of aspect 40, wherein the variable resistive device is configured to have a first resistance in the second gain mode higher than a second resistance in the first gain mode.

Aspect 42: The amplifier of any one of aspects 36-41, wherein the inductor is part of a variable inductor coupled in parallel with the variable capacitive device and the variable resistive device between the first transistor and the second voltage rail, wherein the variable inductor is configured with a first inductance in a first gain mode, and configured with a second inductance in a second gain mode, wherein the second inductance is greater than the first inductance.

Aspect 43: The amplifier of any one of aspects 36-42, further comprising a series inductor coupled to the gate of the first transistor.

Aspect 44: The amplifier of any one of aspects 36-43, wherein the first transistor comprises a field effect transistor (FET).

Aspect 45: The amplifier of any one of aspects 36-44, wherein the first tank circuit is configured to produce a resonance impedance at a first frequency substantially twice a second frequency of the input RF signal.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An amplifier, comprising:
   a first transistor;
   an impedance matching circuit configured to receive an input radio frequency (RF) signal within an operating frequency band of the amplifier, wherein the impedance matching circuit is coupled to a control input of the first transistor;
   an output impedance circuit configured to generate an output RF signal within the operating frequency band; and
   a first tank circuit configured to produce a resonance impedance at a first frequency substantially twice a second frequency of the input RF signal, wherein the output impedance circuit, the first transistor, and the first tank circuit are coupled in series between a first voltage rail and a second voltage rail,
   wherein the first tank circuit comprises:
      a resistive device; and
      a capacitor coupled in series with the resistive device between the first transistor and the second voltage rail.

2. The amplifier of claim 1, wherein the capacitor is configured to have a variable capacitance.

3. The amplifier of claim 1, wherein the resistive device is configured to have a variable resistance.

4. The amplifier of claim 1, wherein the resistive device comprises a second transistor.

5. The amplifier of claim 1, wherein the resistive device comprises a set of parallel transistors, wherein the set of parallel transistors include a set of control inputs configured to receive a set of select signals to control a resistance of the set of parallel transistors, respectively.

6. An amplifier, comprising:

a first transistor;

an impedance matching circuit configured to receive an input radio frequency (RF) signal within an operating frequency band of the amplifier, wherein the impedance matching circuit is coupled to a control input of the first transistor;

an output impedance circuit configured to generate an output RF signal within the operating frequency band; and a first tank circuit configured to produce a resonance impedance at a first frequency substantially twice a second frequency of the input RF signal, wherein the output impedance circuit, the first transistor, and the first tank circuit are coupled in series between a first voltage rail and a second voltage rail, wherein the first tank circuit comprises:

a set of capacitors; and a set of parallel transistor banks coupled in series with the set of capacitors between the first transistor and the second voltage rail, wherein the set of parallel transistor banks include sets of control inputs configured to receive sets of select signals to control a set of resistances of the set of parallel transistor banks, respectively.

7. An amplifier, comprising:

a first transistor;

an impedance matching circuit configured to receive an input radio frequency (RF) signal within an operating frequency band of the amplifier, wherein the impedance matching circuit is coupled to a control input of the first transistor;

an output impedance circuit configured to generate an output RF signal within the operating frequency band; and a first tank circuit configured to produce a resonance impedance at a first frequency substantially twice a second frequency of the input RF signal, wherein the output impedance circuit, the first transistor, and the first tank circuit are coupled in series between a first voltage rail and a second voltage rail, wherein the first tank circuit comprises:

a capacitor;

a resistive device coupled in series with the capacitor between the first transistor and the second voltage rail; and an inductor coupled in parallel with the capacitor and the resistive device between the first transistor and the second voltage rail.

8. The amplifier of claim 7, wherein:

the capacitor is configured to have a variable capacitance;

the resistive device is configured to have a variable resistance; and the inductor is configured to have a variable inductance.

9. An amplifier, comprising:

a first transistor;

an impedance matching circuit configured to receive an input radio frequency (RF) signal within an operating frequency band of the amplifier, wherein the impedance matching circuit is coupled to a control input of the first transistor;

an output impedance circuit configured to generate an output RF signal within the operating frequency band; and a first tank circuit configured to produce a resonance impedance at a first frequency substantially twice a second frequency of the input RF signal, wherein the output impedance circuit, the first transistor, and the first tank circuit are coupled in series between a first voltage rail and a second voltage rail, wherein:

the first tank circuit is configured to produce the resonance impedance at the first frequency substantially twice the second frequency of the input RF signal while the amplifier is operating in a first gain mode; and the first tank circuit is configured to be disabled while the amplifier is operating in a second gain mode.

10. The amplifier of claim 9, wherein the second gain mode is associated with a first gain of the amplifier that is higher than a second gain of the amplifier associated with the first gain mode.

11. The amplifier of claim 9, wherein the first tank circuit comprises:

a capacitor; and a variable resistive device coupled in series with the capacitor between the first transistor and the second voltage rail, wherein the variable resistive device is configured to have a first resistance in the second gain mode higher than a second resistance in the first gain mode.

12. The amplifier of claim 11, wherein the first tank circuit further includes a variable inductor coupled in parallel with the capacitor and resistive device between the first transistor and the second voltage rail, wherein the variable inductor is configured with a first inductance in the first gain mode, and configured with a second inductance in the second gain mode, wherein the second inductance is greater than the first inductance.

13. The amplifier of claim 1, wherein the output impedance circuit comprises a second tank circuit.

14. The amplifier of claim 13, wherein the second tank circuit is configured to produce a three (3) decibel passband substantially coinciding with the operating frequency band of the amplifier.

15. The amplifier of claim 13, wherein the second tank circuit comprises:

an inductor; and a capacitor coupled in parallel with the inductor between the first voltage rail and the first transistor.

16. The amplifier of claim 1, wherein the output impedance circuit comprises at least one cascode transistor.

17. The amplifier of claim 1, wherein the impedance matching circuit is configured to produce a minimum return loss within the operating frequency band of the amplifier.

18. The amplifier of claim 1, wherein the impedance matching circuit comprises a series inductor.

19. The amplifier of claim 1, wherein the first transistor comprises a field effect transistor (FET), wherein the control input comprises a gate of the FET, and wherein the first tank circuit is coupled between a source of the FET and the second voltage rail.

20. The amplifier of claim 1, wherein the first transistor comprises a bipolar junction transistor (BJT), wherein the control input comprises a base of the BJT, and wherein the first tank circuit is coupled between an emitter of the BJT and the second voltage rail.

21. A method of reducing a third-order intermodulation component at a first terminal of a transistor, comprising:

receiving an input radio frequency (RF) signal cycling with a first frequency at a control terminal of the transistor;

generating a feedback RF signal cycling at a second frequency at a second terminal of the transistor, wherein the second frequency is substantially twice the first frequency; and generating a third-order intermodulation cancellation component at the first terminal including combining the input RF signal with the feedback RF signal, wherein the third-order intermodulation cancellation component has a magnitude and phase substantially equal and opposite to a magnitude and phase of the third-order intermodulation component at the first terminal of the transistor, respectively, wherein generating the feedback RF signal at the second terminal of the transistor comprises generating the feedback RF signal via a tank circuit between the second terminal of the transistor and a voltage rail, wherein the tank circuit has a resonance frequency at substantially the second frequency of the feedback RF signal, and wherein the tank circuit comprises:

a resistive device; and a capacitor coupled in series with the resistive device between the transistor and the voltage rail.

22. The method of claim 21, wherein the third-order intermodulation component is generated based on a third-order component of a transconductance gain of the transistor, and wherein the third-order intermodulation cancellation component is generated based on a second-order component of the transconductance gain of the transistor.

23. A wireless communication device, comprising:

at least one antenna;

a transceiver coupled to the at least one antenna, wherein the transceiver comprises a low noise amplifier (LNA) comprising:

a first transistor;

an impedance matching circuit configured to receive an input radio frequency (RF) signal within an operating frequency band of the LNA, wherein the impedance matching circuit is coupled to a control input of the first transistor;

an output impedance circuit configured to generate an output RF signal within the operating frequency band; and a first tank circuit configured to produce a resonance impedance at a frequency substantially twice a frequency of the input RF signal, wherein the output impedance circuit, the first transistor, and the first tank circuit are coupled in series between a first voltage rail and a second voltage rail, wherein the first tank circuit comprises:

a resistive device; and a capacitor coupled in series with the resistive device between the first transistor and the second voltage rail; and a communication processor coupled to the transceiver.

24. An amplifier, comprising:

a first transistor having a gate configured to receive an input radio frequency (RF) signal within an operating frequency band of the amplifier;

a load circuit coupled between a first voltage rail and a drain of the first transistor and configured to generate an output RF signal within the operating frequency band; and a first tank circuit coupled between a source of the first transistor and a second voltage rail, the first tank circuit comprising an inductor coupled between the source of the first transistor and the second voltage rail, the first tank circuit further comprising a variable capacitor device coupled in series with a variable resistive device, the variable capacitor device and the variable resistive device coupled between the source of the first transistor and the second voltage rail.

25. The amplifier of claim 24, wherein the variable resistive device comprises a set of parallel transistors, wherein the set of parallel transistors include a set of control inputs configured to receive a set of select signals to control a resistance of the set of parallel transistors, respectively.

26. The amplifier of claim 24, wherein the first tank circuit comprises:

a set of capacitors forming at least a portion of the variable capacitive device; and a set of parallel transistor banks forming at least a portion of the variable resistive device and coupled in series with the set of capacitors between the first transistor and the second voltage rail, wherein the set of parallel transistor banks include sets of control inputs configured to receive sets of select signals to control a set of resistances of the set of parallel transistor banks, respectively.

27. The amplifier of claim 24, wherein:

the first tank circuit is configured to produce a resonance impedance at a first frequency substantially twice a second frequency of the input RF signal while the amplifier is operating in a first gain mode; and the first tank circuit is configured to be disabled while the amplifier is operating in a second gain mode.

28. The amplifier of claim 27, wherein the second gain mode is associated with a first gain of the amplifier that is higher than a second gain of the amplifier associated with the first gain mode.

* * * * *